United States Patent
Yoon et al.

(10) Patent No.: US 12,538,474 B2
(45) Date of Patent: Jan. 27, 2026

(54) SEMICONDUCTOR DEVICE AND METHOD FOR FABRICATING THE SAME

(71) Applicant: SK hynix Inc., Gyeonggi-do (KR)

(72) Inventors: Hye Won Yoon, Gyeonggi-do (KR); Seung Hwan Kim, Gyeonggi-do (KR); Kang Sik Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 390 days.

(21) Appl. No.: 18/350,763

(22) Filed: Jul. 12, 2023

(65) Prior Publication Data

US 2024/0224500 A1 Jul. 4, 2024

(30) Foreign Application Priority Data

Dec. 30, 2022 (KR) ........................ 10-2022-0190678

(51) Int. Cl.
*H10B 12/00* (2023.01)
*H01L 23/528* (2006.01)

(52) U.S. Cl.
CPC ....... *H10B 12/315* (2023.02); *H01L 23/5283* (2013.01); *H10B 12/02* (2023.02); *H10B 12/30* (2023.02); *H10B 12/48* (2023.02); *H10B 12/482* (2023.02)

(58) Field of Classification Search
CPC ..... H01L 23/5283; H10B 12/00; H10B 12/02; H10B 12/30; H10B 12/315; H10B 12/48; H10B 12/482
See application file for complete search history.

(56) References Cited

U.S. PATENT DOCUMENTS

| | | | |
|---|---|---|---|
| 2021/0012828 A1* | 1/2021 | Kim | G11C 11/4097 |
| 2022/0005809 A1* | 1/2022 | Kim | H10B 12/482 |
| 2022/0045094 A1 | 2/2022 | Lee et al. | |
| 2022/0068859 A1 | 3/2022 | Choi et al. | |
| 2022/0102358 A1* | 3/2022 | Park | H10B 12/03 |
| 2022/0246619 A1* | 8/2022 | Kim | H10B 12/50 |
| 2022/0399340 A1* | 12/2022 | Kim | H10B 12/485 |
| 2023/0048424 A1* | 2/2023 | Kim | H10D 30/6757 |
| 2023/0413517 A1* | 12/2023 | Kim | H10B 12/48 |
| 2024/0196594 A1* | 6/2024 | An | H10B 12/01 |

FOREIGN PATENT DOCUMENTS

| | | | | |
|---|---|---|---|---|
| CN | 118284036 A | * | 7/2024 | H10D 1/711 |
| JP | 2024095980 A | * | 7/2024 | H10D 1/711 |

* cited by examiner

*Primary Examiner* — Matthew E Warren
(74) *Attorney, Agent, or Firm* — IP & T GROUP LLP

(57) ABSTRACT

A semiconductor device including highly integrated memory cells and a method for fabricating the same. The semiconductor device may include: a vertical conductive line; a horizontal layer horizontally oriented from the vertical conductive line and including a first horizontal portion and a second horizontal portion thinner than the first horizontal portion; a horizontal conductive line crossing the first horizontal portion of the horizontal layer; and a data storage element including a first electrode including a merged double cylinder coupled to the second horizontal portion of the horizontal layer.

15 Claims, 13 Drawing Sheets

SEMICONDUCTOR DEVICE AND METHOD FOR FABRICATING THE SAME

CROSS-REFERENCE TO RELATED APPLICATION

This application claims priority under 35 U.S.C. § 119 to Korean Patent Application No. 10-2022-0190678 filed on Dec. 30, 2022, which is incorporated herein by reference in its entirety.

BACKGROUND

1. Field

Various embodiments relate to a semiconductor device, and more particularly, to a semiconductor device including a three-dimensional (3D) memory cell and a method for fabricating the same.

2. Discussion of the Related Art

Recently, in order to cope with an increase in capacity and miniaturization of a memory device, a technology for providing a three dimensional (3D) memory device in which a plurality of memory cells are stacked has been realized.

SUMMARY

Various embodiments of the present disclosure are directed to providing a semiconductor device including highly integrated memory cells and a method for fabricating the same.

A semiconductor device in accordance with one embodiment of the present disclosure may include: a vertical conductive line; a horizontal layer horizontally oriented from the vertical conductive line and including a first horizontal portion and a second horizontal portion thinner than the first horizontal portion; a horizontal conductive line crossing the first horizontal portion of the horizontal layer; and a data storage element including a first electrode including a merged double cylinder coupled to the second horizontal portion of the horizontal layer.

A method for fabricating a semiconductor device in accordance with another embodiment of the present disclosure may include: forming a horizontal layer oriented over a lower structure in parallel to a surface of the lower structure, the horizontal layer including a first horizontal portion and a second horizontal portion horizontally extending from the first horizontal portion, the second horizontal portion thinner than the first horizontal portion; forming a vertical conductive line coupled to the first horizontal portion of the horizontal layer and vertically oriented from the lower structure; and forming a data storage element including a first electrode coupled to the second horizontal portion of the horizontal layer and covering the second horizontal portion. The forming a data storage element further include forming a dielectric layer over the first electrode; and forming a second electrode over the dielectric layer. The forming a horizontal layer may include forming, over the lower structure, a stack body in which a first dielectric layer, a first sacrificial layer, a semiconductor layer, a second sacrificial layer, and a second dielectric layer are stacked in this order; forming an opening by etching the stack body; forming a pair of electrode level-recesses by recessing the first sacrificial layer and the second sacrificial layer from the opening; and performing a thinning treatment over a part of the semiconductor layer exposed by the pair of electrode level-recesses, to form the second horizontal portion. The forming a data storage element including a first electrode comprises, after the performing of the thinning treatment over the part of the semiconductor layer: forming an electrode material that covers exposed surfaces of the second horizontal portion and the pair of electrode level-recesses; forming an etch stopper over the electrode material to fill the pair of electrode level-recesses; etching the electrode material by using the etch stopper as a barrier, to form the first electrode; and removing the etch stopper, wherein the first electrode includes a merged double cylinder structure that covers the exposed surfaces of the second horizontal portion. The forming a pair of electrode level-recesses may include forming a pair of sacrificial layer level-recesses that expose the part of the semiconductor layer by recessing the first sacrificial layer and the second sacrificial layer from the opening; forming a capping material that fills the pair of sacrificial layer level-recesses; and etching the capping material to form the pair of electrode level-recesses. The method for fabricating a semiconductor device further including, before the forming a vertical conductive line: forming double horizontal conductive lines that cross an upper surface and a lower surface of a first portion of the horizontal layer, respectively. The first electrode may include a first cylinder disposed over an upper surface of the second horizontal portion of the horizontal layer; a second cylinder disposed below a lower surface of the second horizontal portion of the horizontal layer; and a connection portion disposed between the first cylinder and the second cylinder. The first cylinder includes a first inner surface and an uppermost level outer surface, and the second cylinder includes a second inner surface and a lowermost level outer surface. The second electrode may include a vertically oriented electrode body; a plurality of inner extension portions horizontally extending from the electrode body and disposed over a first inner surface of the first cylinder and a second inner surface of the second cylinder; and a plurality of outer extension portions horizontally extending from the electrode body and disposed above an uppermost level outer surface of the first cylinder and below a lowermost level outer surface of the second cylinder. The method for fabricating a semiconductor device further include, before the forming a data storage element including a first electrode: forming a doped region in the second horizontal portion of the horizontal layer; and forming an ohmic contact that covers the doped region.

A method for fabricating a semiconductor device in accordance with still another embodiment of the present disclosure may include: forming, over a lower structure, a stack body in which a first dielectric layer, a first sacrificial layer, a semiconductor layer, a second sacrificial layer, and a second dielectric layer are stacked in this order; forming an opening extending through the stack body; recessing the first and second sacrificial layers to form a pair of electrode level-recesses that expose a part of the semiconductor layer adjacent to the opening; performing a thinning treatment over an exposed portion of the semiconductor layer to form a thinned semiconductor layer; forming an electrode material that covers the pair of electrode level-recesses and the thinned semiconductor layer; and etching the electrode material to form a first electrode of a data storage element, wherein the first electrode includes a merged double cylinder structure that covers an upper surface and a lower surface of the thinned semiconductor layer, and a side surface between the upper surface and the lower surface of the thinned semiconductor layer. The method further including forming a dielectric layer of a data storage element over the first electrode; and forming a second electrode of the data storage element over the dielectric layer. The method further comprising, before the etching the electrode material to form a first electrode: forming a doped region in the thinned semiconductor layer; and forming a metal-base ohmic contact that covers the doped region. The etching the electrode material may include forming an etch stopper over the electrode material to fill the pair of electrode level recesses; and etching the electrode material by using the etch stopper as a barrier. The first electrode may include a first cylinder disposed over an upper surface of the second horizontal portion of the horizontal layer; a second cylinder disposed below a lower surface of the second horizontal portion of the horizontal layer; and a connection portion disposed between the first cylinder and the second cylinder. The first cylinder includes a first inner surface and an uppermost level outer surface, and the second cylinder includes a second inner surface and a lowermost level outer surface. The method further including sequentially forming a dielectric layer and a second electrode over the first electrode, wherein the second electrode comprises: a vertically oriented electrode body; a plurality of inner extension portions horizontally extending from the electrode body and disposed over a first inner surface of the first cylinder and a second inner surface of the second cylinder; and a plurality of outer extension portions horizontally extending from the electrode body and disposed above an uppermost level outer surface of the first cylinder and below a lowermost level outer surface of the second cylinder.

According to the present disclosure, since a data storage element includes a dual or double cylinder, the storage capacity of the data storage element can be increased.

DETAILED DESCRIPTION

Figure 1:
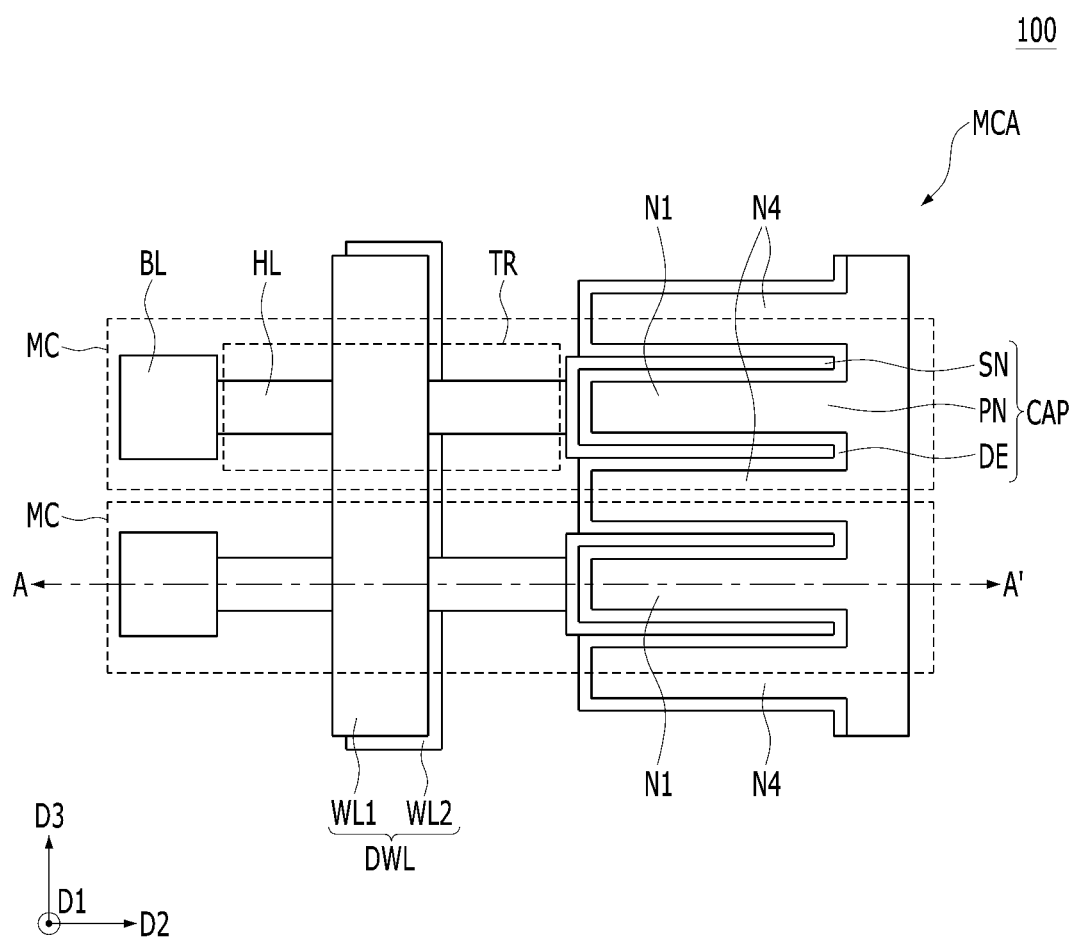
FIG. 1 is a schematic plan view of a semiconductor device in accordance with one embodiment.

Embodiments described herein will be described with reference to cross-sectional views, plan views, and block diagrams, which are ideal schematic diagrams of the present disclosure. Accordingly, the shapes of the illustrative drawings may be modified due to manufacturing techniques and/or tolerances. Accordingly, embodiments of the present disclosure are not limited to the illustrated specific shapes, and also include changes in shapes generated according to fabrication processes. Accordingly, regions illustrated in the drawings have schematic attributes, and the shapes of the regions illustrated in the drawings are intended to illustrate a specific shape of a region of a device and are not intended to limit the scope of the disclosure.

Embodiments to be described below can increase memory cell density and reduce parasitic capacitance by vertically stacking memory cells.

Figure 2A:
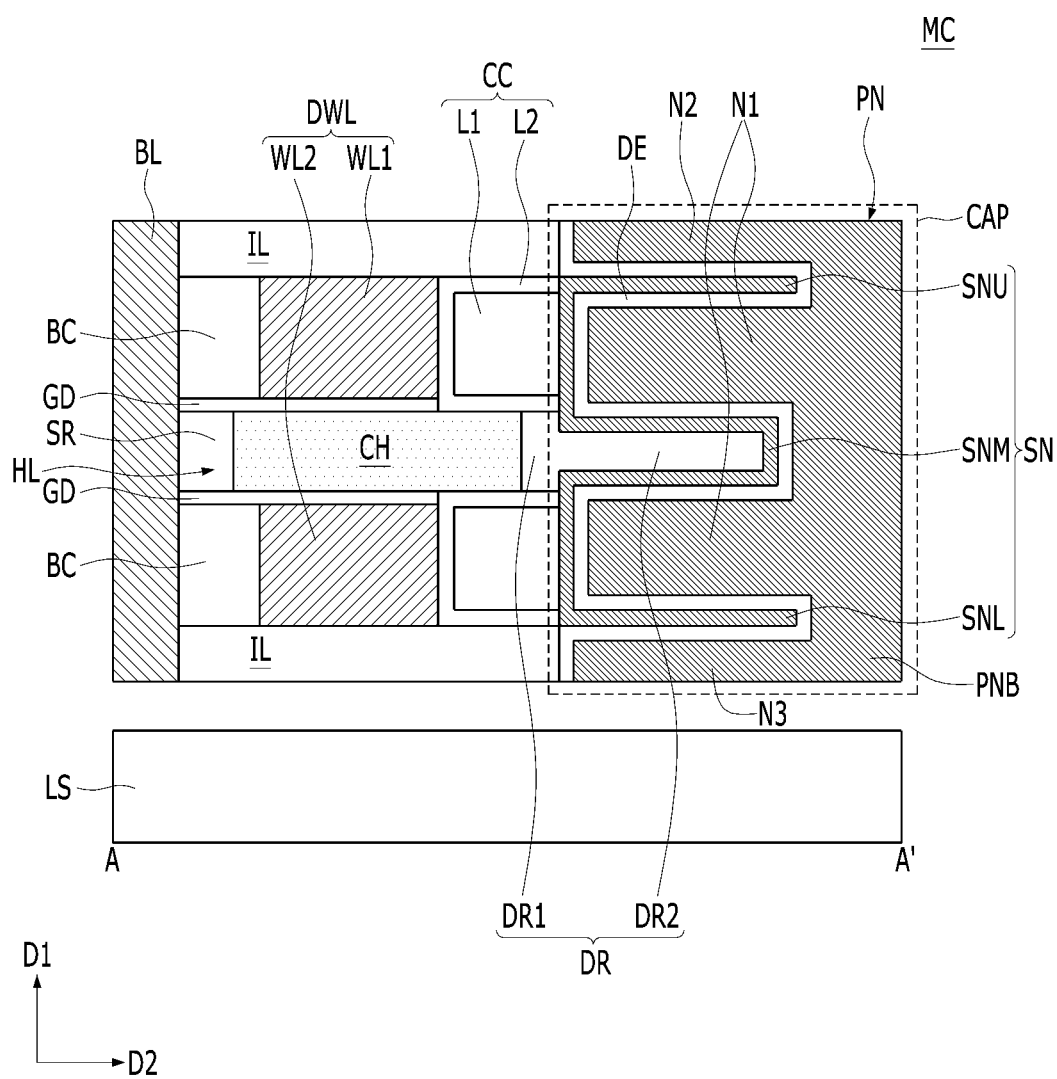
FIG. 2A is a schematic cross-sectional view taken along A-A' in FIG. 1.
Figure 2B:
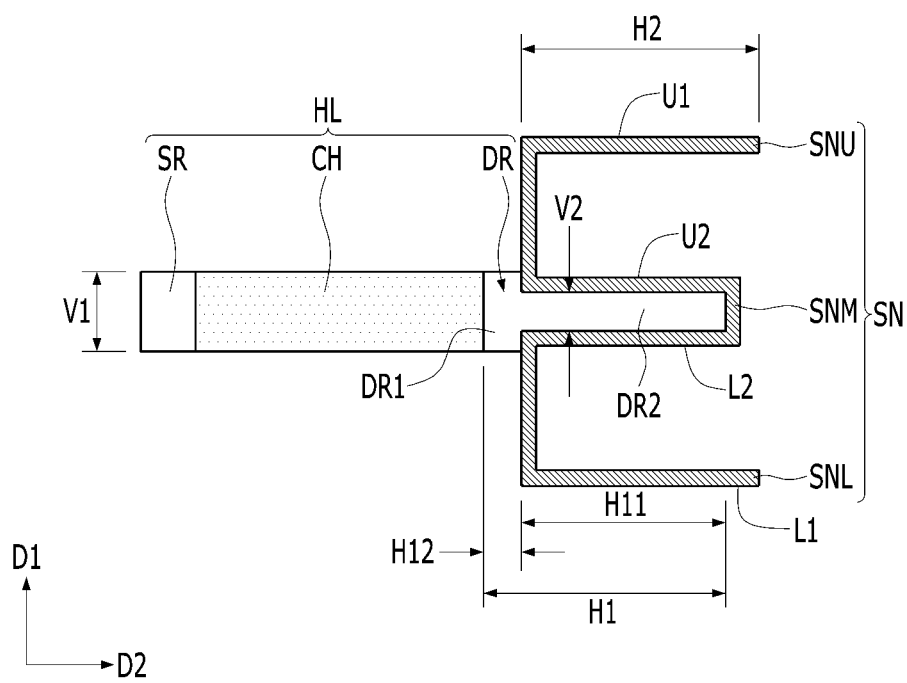
FIG. 2B is a detailed view of a horizontal layer and a first electrode in FIG. 2A.

FIG. 1 is a schematic plan view of a semiconductor device 100 in accordance with one embodiment. FIG. 2A is a schematic cross-sectional view taken along A-A' in FIG. 1. FIG. 2B is a detailed view of a horizontal layer and a first electrode in FIG. 2A.

Referring to FIG. 1, FIG. 2A, and FIG. 2B, the semiconductor device 100 may include a lower structure LS and a memory cell array MCA. The memory cell array MCA may include a three-dimensional array of memory cells MC. The three-dimensional array of the memory cells MC may include a column array of the memory cells MC and a row array of the memory cells MC. The column array of the memory cells MC may include a plurality of memory cells MC stacked along a first direction D1, and the row array of the memory cells MC may include a plurality of memory cells MC horizontally disposed along a third direction D3. Cell dielectric layers IL may be disposed between the memory cells MC stacked along the first direction D1. For example, the memory cell array MCA in FIG. 1 shows the row array of the memory cells MC horizontally disposed along the third direction D3.

The individual memory cell MC may include a vertical conductive line BL, a switching element TR, and a data storage element CAP. The switching element TR may include a horizontal layer HL, a horizontal dielectric layer GD, and a horizontal conductive line DWL. The data storage element CAP may include a memory element such as a capacitor. The vertical conductive line BL may include a bit line. The horizontal conductive line DWL may include a word line or a gate electrode, and the horizontal layer HL may include an active layer. The data storage element CAP may include a first electrode SN, a dielectric layer DE, and a second electrode PN. The switching element TR may include a transistor, and in such a case, the horizontal conductive line DWL may serve as a gate electrode. The switching element TR may also be referred to as an access element or a select element.

The vertical conductive line BL may extend vertically along the first direction D1. The horizontal layer HL may extend along a second direction D2 intersecting the first direction D1. The horizontal conductive line DWL may extend along the third direction D3 intersecting the first direction D1 and the second direction D2. The first direction D1 may be a vertical direction, the second direction D2 may be a first horizontal direction, and the third direction D3 may be a second horizontal direction.

The vertical conductive line BL may be vertically oriented along the first direction D1. The vertical conductive line BL may be referred to as a vertically-oriented bit line, a vertically-extended bit line, or a pillar-shaped bit line. The vertical conductive line BL may include a conductive material. The vertical conductive line BL may include a silicon-base material, a metal-base material, or a combination thereof. The vertical conductive line BL may include for example polysilicon, metal, metal nitride, metal silicide, or a combination thereof. The vertical conductive line BL may include for example polysilicon, titanium nitride, tungsten, or a combination thereof. For example, the vertical conductive line BL may include polysilicon or titanium nitride (TIN) doped with N-type impurities. The vertical conductive line BL may include a stack (TiN/W) of titanium nitride and tungsten.

The switching element TR may include a transistor, and thus, the horizontal conductive line DWL may be referred to as a horizontal gate line or a horizontal word line. The horizontal conductive line DWL may have a double structure. For example, the horizontal conductive line DWL may include first and second horizontal conductive lines WL1 and WL2 facing each other with the horizontal layer HL interposed therebetween. In the horizontal conductive line DWL, the first horizontal conductive line WL1 and the second horizontal conductive line WL2 may have substantially the same potential. For example, the first horizontal conductive line WL1 and the second horizontal conductive line WL2 may be paired with each other and be coupled to one memory cell MC. Substantially the same driving voltage may be applied to the first horizontal conductive line WL1 and the second horizontal conductive line WL2. The first horizontal conductive line WL1 may be disposed above the horizontal layer HL, and the second horizontal conductive line WL2 may be disposed below the horizontal layer HL. The horizontal conductive line DWL may include a pair of the first horizontal conductive line WL1 and the second horizontal conductive line WL2.

The horizontal conductive line DWL may extend along the third direction D3, and the horizontal layer HL may extend along the second direction D2. The horizontal layer HL may be horizontally arranged from the vertical conductive line BL. The horizontal dielectric layer GD may be formed on each of an upper surface and a lower surface of the horizontal layer HL.

The horizontal layer HL may extend along the second direction D2. The horizontal layer HL may comprise a semiconductor material. For example, the horizontal layer HL may include for example polysilicon, single crystal silicon, germanium, or silicon-germanium. In another embodiment, the horizontal layer HL may include an oxide semiconductor material. Examples of the oxide semiconductor material may include indium gallium zinc oxide (IGZO).

The horizontal layer HL may include a channel CH, a first doped region SR between the channel CH and the vertical conductive line BL, and a second doped region DR between the channel CH and the data storage element CAP. When the horizontal layer HL is an oxide semiconductor material, the channel CH may be made of an oxide semiconductor material, and the first and second doped regions SR and DR may be omitted. The horizontal layer HL may also be referred to as an active layer or a thin-body. The first doped region SR and the second doped region DR may be referred to as first and second source/drain regions.

The first doped region SR and the second doped region DR may be doped with substantially the same conductivity type of impurities. The first doped region SR and the second doped region DR may be doped with N-type impurities or P-type impurities. The first doped region SR and the second doped region DR may each include at least one impurity selected from arsenic (As), phosphorus (P), boron (B), indium (In), and a combination thereof. The first doped region SR may be coupled to the vertical conductive line BL, and the second doped region DR may be coupled to the first electrode SN of the data storage element CAP. As illustrated in FIG. 2A, a part of the second doped region DR closer to the data storage element CAP is thinner than the first doped region SR and the channel CH.

The second doped region DR may include a body portion DR1 and a protrusion DR2. The body portion DR1 of the second doped region DR may directly contact the channel CH, and the protrusion DR2 of the second doped region DR may extend horizontally from the body portion DR1. The protrusion DR2 of the second doped region DR may refer to a thinned portion of the horizontal layer HL. As illustrated in FIG. 2B, a horizontal orientation length H1 of the second doped region DR may include a horizontal orientation length H11 of the protrusion DR2 and a horizontal orientation length H12 of the body portion DR1. The horizontal orientation length H11 of the protrusion DR2 of the second doped region DR may be greater than the horizontal orientation length H12 of the body portion DR1. The horizontal orientation lengths H1, H11, and H12 may refer to lengths along the second direction D2.

The protrusion DR2 of the second doped region DR may have a smaller vertical thickness than the body portion DR1. As illustrated on FIG. 2B, in the horizontal layer HL, vertical thicknesses V1 of the first doped region SR, the channel CH, and the body portion DR1 of the second doped region DR may be substantially the same as one another, and a vertical thickness V2 of the protrusion DR2 of the second doped region DR may be smaller than the vertical thicknesses V1 of the body portion DR1, the channel CH, and the first doped region SR. The vertical thicknesses V1 and V2 may refer to thicknesses or heights along the first direction D1.

As described above, the horizontal layer HL may be horizontally oriented from the vertical conductive line BL, and may include a first horizontal portion and a second horizontal portion thinner than the first horizontal portion. The first horizontal portion of the horizontal layer HL may include the first doped region SR, the channel CH, and the body portion DR1 of the second doped region DR. The second horizontal portion of the horizontal layer HL may include the protrusion DR2 of the second doped region DR.

The horizontal dielectric layer GD may be formed on each of the upper surface and the lower surface of the horizontal layer HL. The horizontal dielectric layer GD may be formed on each of the upper surface and the lower surface of the first doped region SR, and may extend to be formed on a part of the upper surface and a part of the lower surface of the channel CH.

The horizontal dielectric layer GD may include a gate dielectric layer. The horizontal dielectric layer GD may include for example silicon oxide, silicon nitride, metal oxide, metal oxynitride, metal silicate, high-k material, ferroelectric material, anti-ferroelectric material, or a combination thereof. The horizontal dielectric layer GD may include for example $SiO_2$, $Si_3N_4$, $HfO_2$, $Al_2O_3$, $ZrO_2$, AlON, HfON, HfSiO, HfSION, or a combination thereof.

The horizontal conductive line DWL may include metal, a metal mixture, a metal alloy, or a semiconductor material. The horizontal conductive line DWL may include for example titanium nitride, tungsten, molybdenum, ruthenium, polysilicon, or a combination thereof. For example, the horizontal conductive line DWL may include a TiN/W stack in which titanium nitride and tungsten are sequentially stacked. The horizontal conductive line DWL may include an N-type work function material or a P-type work function material. The N-type work function material may have a low work function of 4.5 eV or less, and the P-type work function material may have a high work function of 4.5 eV or more.

Each of the first and second horizontal conductive lines WL1 and WL2 may have a dual work function structure. The structure may be a dual work function structure in which a low work function material and a high work function material are horizontally disposed. For example, each of the first and second horizontal conductive lines WL1 and WL2 may have a metal-poly-Si (MP) structure horizontally disposed along the second direction D2. The MP structure may refer to a structure in which metal and polysilicon are horizontally disposed. In the MP structure, the polysilicon may be N-type dopant doped polysilicon. The N-type dopant may include phosphorus or arsenic. In the MP structure, the metal may include titanium nitride, tungsten, or combinations thereof. In this example, the polysilicon is the low work function material, and the metal is the high work function material.

The data storage element CAP may be horizontally disposed along the second direction D2 from the switching element TR. The data storage element CAP may include the first electrode SN extending horizontally from the horizontal layer HL along the second direction D2. The data storage element CAP may further include the second electrode PN on the first electrode SN and the dielectric layer DE between the first electrode SN and the second electrode PN. The first electrode SN, the dielectric layer DE, and the second electrode PN may be horizontally arranged along the second direction D2. The first electrode SN may have a horizontally oriented cylindrical shape. The dielectric layer DE may conformally cover a cylindrical inner wall and a cylindrical outer wall of the first electrode SN. The second electrode PN may cover the cylindrical inner wall and the cylindrical outer wall of the first electrode SN on the dielectric layer DE. The first electrode SN may be electrically connected to the second doped region DR.

The first electrode SN may have a three-dimensional structure. In an embodiment, the first electrode SN having the three-dimensional structure may have a horizontal three-dimensional structure oriented along the second direction D2. In an example of the three-dimensional structure, the first electrode SN may have a cylindrical shape. In another embodiment, the first electrode SN may have a pillar shape or a pylinder shape. The pylinder shape may refer to a structure in which a pillar shape and a cylindrical shape are merged.

The first electrode SN and the second electrode PN may each include for example metal, noble metal, metal nitride, conductive metal oxide, conductive noble metal oxide, metal carbide, metal silicide, or a combination thereof. For example, the first electrode SN and the second electrode PN may each include for example titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The second electrode PN may include a combination of a metal-base material and a silicon-base material. For example, the second electrode PN may be a stack (TIN/SiGe/WN) of titanium nitride/silicon germanium/tungsten nitride. In the titanium nitride/silicon germanium/tungsten nitride (TiN/SiGe/WN) stack, silicon germanium may be a gap-fill material for filling the cylinder inside of the first electrode SN, titanium nitride (TiN) may serve as the second electrode PN of the data storage element CAP, and tungsten nitride may be a low-resistance material.

The dielectric layer DE may be referred to as a capacitor dielectric layer or a memory layer. The dielectric layer DE may include silicon oxide, silicon nitride, a high-k material, or a combination thereof. The high-k material may have a higher dielectric constant than silicon oxide ($SiO_2$). The silicon oxide ($SiO_2$) may have a dielectric constant of about 3.9, and the dielectric layer DE may include a high-k material having a dielectric constant of 4 or more. The high-k material may have a dielectric constant of about 20 or greater. The high-k material may include for example hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer DE may also include a composite layer including two or more layers of the high-k material described above.

The dielectric layer DE may be made of zirconium-base oxide (Zr-base oxide). The dielectric layer DE may have a stack structure including zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-base layer ($ZrO_2$-base layer). In another embodiment, the dielectric layer DE may be made of hafnium-base oxide (Hf-base oxide). The dielectric layer DE may have a stack structure including hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide-base layer ($HfO_2$-base layer). In the ZA stack, the ZAZ stack, the HA stack, and the HAH stack, aluminum oxide ($Al_2O_3$) would have a higher bandgap than zirconium oxide ($ZrO_2$) and hafnium oxide ($HfO_2$). Aluminum oxide ($Al_2O_3$) would have a lower dielectric constant than zirconium oxide ($ZrO_2$) and hafnium oxide ($HfO_2$). Accordingly, the dielectric layer DE may include a stack of a high-k material and a high bandgap material having a higher bandgap than the high-k material. The dielectric layer DE may also include silicon oxide ($SiO_2$) as another high bandgap material in addition to aluminum oxide ($Al_2O_3$). Since the dielectric layer DE includes a high bandgap material, leakage current may be suppressed. The high bandgap material may be thinner than the high-k material. In another embodiment, the dielectric layer DE may include a laminated structure in which a high-k material and a high bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, an HAHA ($HfO_2/Al_2O_3/HfO_2/Al_2O_3$) stack, or an HAHAH ($HfO_2/Al_2O_3/HfO_2/Al_2O_3/HfO_2$) stack. In the above laminated structures, aluminum oxide ($Al_2O_3$) may be thinner than zirconium oxide ($ZrO_2$) and hafnium oxide ($HfO_2$).

In another embodiment, the dielectric layer DE may include a stack structure, a laminated structure, or a mutual mixing structure including zirconium oxide, hafnium oxide, and aluminum oxide.

In another embodiment, an interface control layer for reducing leakage current may be further formed between the first electrode SN and the dielectric layer DE. The interface control layer may include for example titanium oxide ($TiO_2$), tantalum oxide ($Ta_2O_5$), or niobium oxide ($Nb_2O_5$). The interface control layer may also be formed between the second electrode PN and the dielectric layer DE.

The data storage element CAP may include a metal-insulator-metal (MIM) capacitor. The first electrode SN and the second electrode PN may each include a metal-base material.

The data storage element CAP may also be replaced with another data storage material. For example, the data storage material may be a phase change material, a magnetic tunnel junction (MTJ), or a variable resistance material.

As illustrated in FIG. 2A, a first capping layer BC may be disposed between the vertical conductive line BL and the horizontal conductive line DWL. A second capping layer CC may be disposed between the horizontal conductive line DWL and the first electrode SN. The first and second capping layers BC and CC may each include an dielectric material. The first and second capping layers BC and CC may each include for example silicon oxide, silicon nitride, SiCN, SiCO, SiCON, or a combination thereof. The second capping layer CC may include a stack of a first liner L1 and a second liner L2. The first liner L1 may be silicon oxide, and the second liner L2 may be silicon nitride. The second liner L2 may be disposed between the first liner L1 and the first electrode SN. The first liner L1 may include an inner surface contacting the second liner L2.

The data storage element CAP will be described in detail with reference to FIG. 1 and FIG. 2B.

The first electrode SN of the data storage element CAP may have a hybrid cylindrical structure. For example, the first electrode SN may include a first cylinder SNU, a second cylinder SNL, and a connection portion SNM. The connection portion SNM may be disposed between the first cylinder SNU and the second cylinder SNL. The first cylinder SNU, the second cylinder SNL, and the connection portion SNM may have an integrated structure, and thus the first electrode SN may have a merged double cylinder structure.

As illustrated in FIG. 2A, the first cylinder SNU may be coupled to the upper surface of the second doped region DR for example along the upper surface of protrusion DR2, and the second cylinder SNL may be coupled to the lower surface of the second doped region DR for example along the lower surface of protrusion DR2. The second doped region DR (and in particular protrusion DR2) may be disposed between the first cylinder SNU and the second cylinder SNL.

As illustrated in FIG. 2B, a horizontal orientation length H2 of each of the first and second cylinders SNU and SNL may be substantially the same as the horizontal orientation length H11 of the protrusion DR2 of the second doped region DR. In another embodiment, the horizontal orientation length H2 of each of the first and second cylinders SNU and SNL may be less than the horizontal orientation length H11 of the protrusion DR2 of the second doped region DR. In another embodiment, the horizontal orientation length H2 of each of the first and second cylinders SNU and SNL may be greater than the horizontal orientation length H11 of the protrusion DR2 of the second doped region DR. The horizontal orientation length may refer to a horizontal length along the second direction D2.

As illustrated in FIG. 2B, the first cylinder SNU may include a highest level-outer surface U1 and a first inner surface U2, and the second cylinder SNL may include a lowest level-outer surface L1 and a second inner surface L2. The connection portion SNM may be disposed between the first inner surface U2 and the second inner surface L2. The highest level-outer surface U1 may be disposed at a higher level than the lowest level-outer surface L1, and the first inner surface U2 may be disposed at a higher level than the second inner surface L2. The connection portion SNM, the first inner surface U2, and the second inner surface L2 may be portions of the first electrode SN contacting the protrusion DR2 of the second doped region DR. The highest level-outer surface U1 and the lowest level-outer surface L1 may have substantially the same horizontal orientation length H2. The horizontal orientation length H2 of each of the highest level-outer surface U1 and the lowest level-outer surface L1 may be greater than the horizontal orientation length H11 of the protrusion DR2 of the second doped region DR.

As illustrated in FIG. 2A, the second electrode PN may include an electrode body PNB and extension portions $N_1$ to $N_3$ expanding or otherwise extending from the electrode body PNB. The electrode body PNB may be coupled in common to the extension portions $N_1$ to $N_3$. The electrode body PNB and the extension portions $N_1$ to $N_3$ may have an integral structure. The extension portions $N_1$ to $N_3$ may include first extension portions $N_1$, a second extension portion $N_2$, and a third extension portion $N_3$. The first extension portions $N_1$ may be disposed on the inner sides of the first and second cylinders SNU and SNL. The second extension portion $N_2$ may be disposed above the highest level-outer surface of the first electrode SN, and the third extension portion $N_3$ may be disposed below the lowest level-outer surface of the first electrode SN. Referring back to FIG. 1, the second electrode PN may further include horizontal level extension portions $N_4$.

The second electrodes PN of the data storage elements CAP may be merged with each other. The horizontal layers HL of the switching elements TR horizontally disposed along the third direction D3 may share one horizontal conductive line DWL. The horizontal layers HL of the switching elements TR horizontally disposed along the third direction D3 may be coupled to different vertical conductive lines BL. The switching elements TR stacked along the first direction D1 may share one vertical conductive line BL. The switching elements TR horizontally disposed along the third direction D3 may share one horizontal conductive line DWL.

The lower structure LS may include a semiconductor substrate or a peripheral circuit unit. The lower structure LS may be disposed at a lower level than the memory cell array MCA. This may be referred to as a cell over PERI (COP) structure. The peripheral circuit unit may include at least one control circuit for driving the memory cell array MCA. The at least one control circuit of the peripheral circuit unit may include an N-channel transistor, a P-channel transistor, a CMOS circuit, or a combination thereof. The at least one control circuit of the peripheral circuit unit may include an address decoder circuit, a read circuit, a write circuit, and the like. The at least one control circuit of the peripheral circuit unit may include a planar channel transistor, a recess channel transistor, a buried gate transistor, a fin channel transistor (FinFET), and the like.

For example, the peripheral circuit unit may include sub-word line drivers and a sense amplifier. The horizontal conductive lines DWL may be coupled to the sub-word line drivers. The vertical conductive line BL may be coupled to the sense amplifier.

In another embodiment, the peripheral circuit unit may be disposed at a higher level than the memory cell array MCA. This may be referred to as a PERI over cell (POC) structure.

As described above, the memory cell MC according to the present embodiment may have a hybrid cylinder structure in which the first electrode SN of the data storage element CAP includes the first cylinder SNU and the second cylinder SNL. The formation of the first electrode SN having the hybrid cylinder structure makes it possible to increase the storage capacity of the data storage element CAP without increasing the length of the cylinder.

Additionally, the formation of the first cylinder SNU and the second cylinder SNL results in a double cylinder structure in which two cylinders are formed per one memory cell MC, which makes it possible to increase the surface area of the first electrode SN and thus to increase the storage capacity of the data storage element CAP.

The first electrode SN is formed to contact the protrusion of the horizontal layer HL, that is, the upper surface and the lower surface of the second doped region DR, which makes it possible to further increase the storage capacity of the data storage element CAP.

FIG. 3 to FIG. 19 are views for explaining an example of a method for fabricating a semiconductor device in accordance with the various embodiments disclosed.

Figure 3:
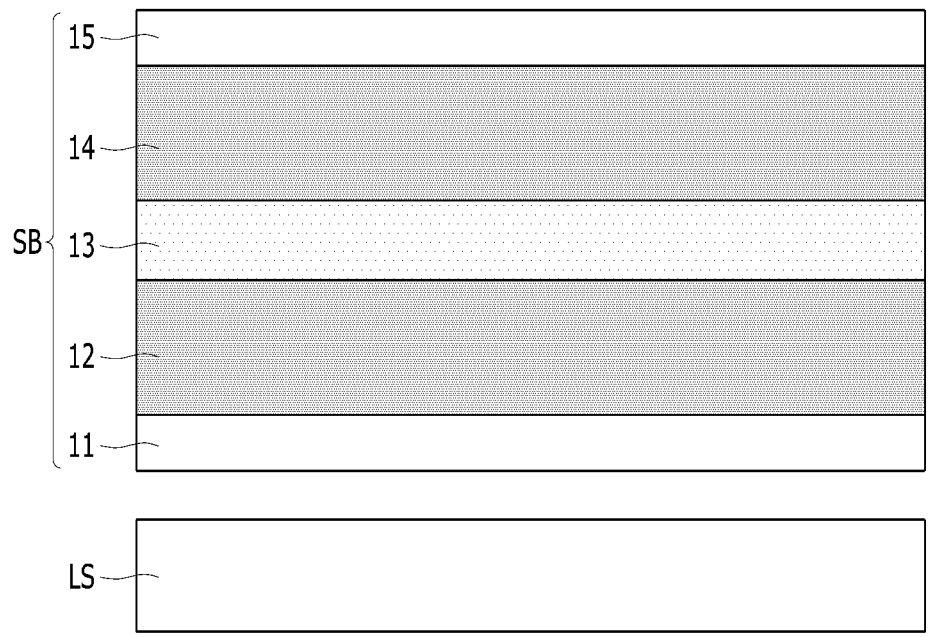
FIG. 3 to FIG. 19 are views for explaining an example of a method for fabricating a semiconductor device in accordance with embodiments.

As illustrated in FIG. 3, a stack body SB may be formed on a lower structure LS. In the stack body SB, a first dielectric layer 11, a first sacrificial layer 12, a semiconductor layer 13, a second sacrificial layer 14, and a second dielectric layer 15 may be stacked in this order. An example of a cell dielectric layer (or cell isolation layer) of the first dielectric layer 11 and/or the second dielectric layer 15 may include an dielectric material such as silicon oxide. The first sacrificial layer 12 and the second sacrificial layer 14 may each include an dielectric material, for example, silicon nitride. The semiconductor layer 13 may include polysilicon, single crystal silicon, or an oxide semiconductor. The stack body SB may include an oxide-nitride-silicon-nitride-oxide (ONSNO) stack. In another embodiment, forming an ONSNO stack may include a step of forming a plurality of SiGe/Si stacks by using epitaxial growth and a step of replacing the plurality of SiGe/Si stacks with the ONSNO stack. The plurality of SiGe/Si stacks may include for example a first SiGe/Si/SiGe stack, a single crystal silicon layer, and a second SiGe/Si/SiGe stack, wherein the first and second SiGe/Si/SiGe stacks may be replaced with first and second oxide-nitride (ON) stacks, respectively, and the single-crystal silicon layer may be thinned. The replaced first ON stack may include a stack of the first dielectric layer 11 and the first sacrificial layer 12. The replaced second ON stack may include a stack of the second sacrificial layer 14 and the second dielectric layer 15, and a thinned single crystal silicon layer may form the semiconductor layer 13.

Figure 4:
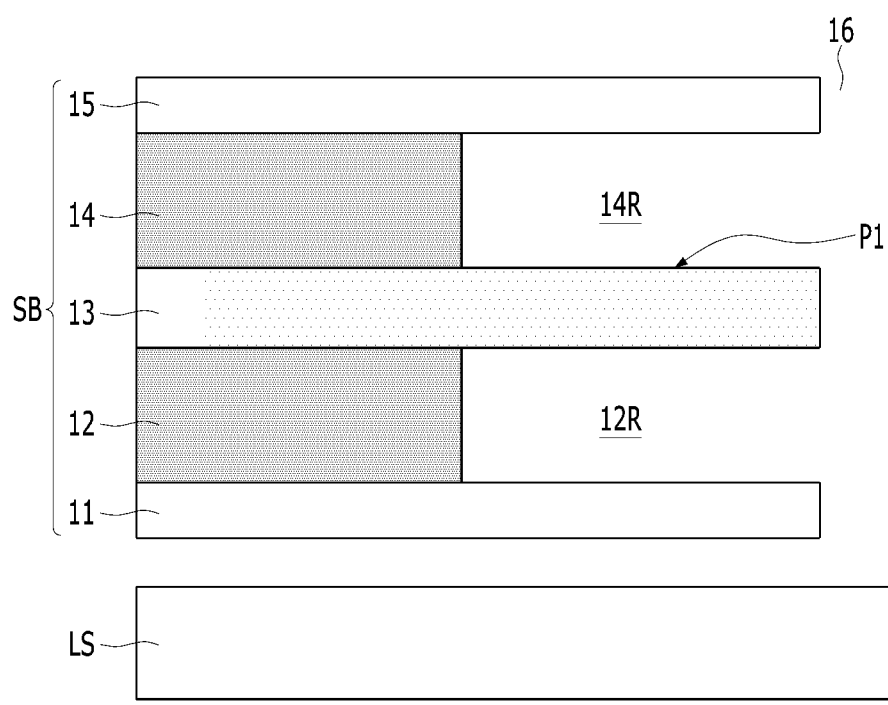

As illustrated in FIG. 4, a part of the stack body SB may be etched to form a first opening 16. The first opening 16 may extend vertically from the surface of the lower structure LS.

Subsequently, the first and second sacrificial layers 12 and 14 may be selectively removed by the first opening 16. Accordingly, sacrificial layer level-recesses 12R and 14R may be formed to expose an upper surface and a lower surface of a first portion P1 of the semiconductor layer 13.

Figure 5:
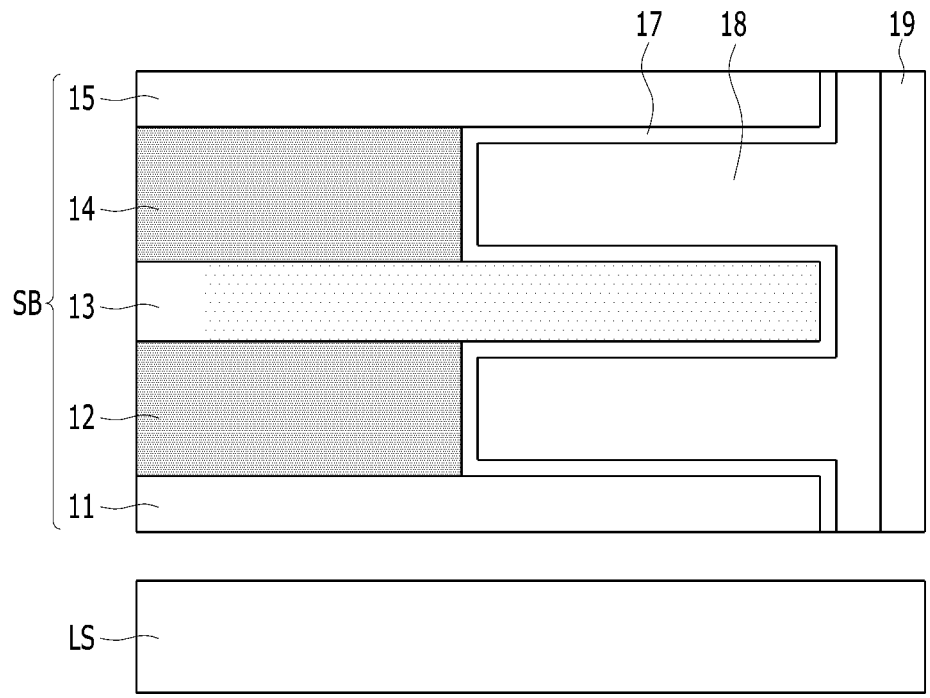

As illustrated in FIG. 5, a capping material filling the sacrificial layer level-recesses 12R and 14R may be formed. The capping material may include a first liner layer 17 and a second liner layer 18. First, the first liner layer 17 may be conformally formed on the sacrificial layer level-recesses 12R and 14R, and then the second liner layer 18 may be formed on the first liner layer 17. The first liner layer 17 may include silicon oxide, and the second liner layer 18 may include silicon nitride. The second liner layer 18 may fill the sacrificial layer level-recesses 12R and 14R on the first liner layer 17.

Subsequently, a gap-fill sacrificial layer 19 may be formed on the second liner layer 18. The gap-fill sacrificial layer 19 may include silicon oxide, silicon nitride, amorphous carbon, metal nitride, or a combination thereof.

Figure 6:
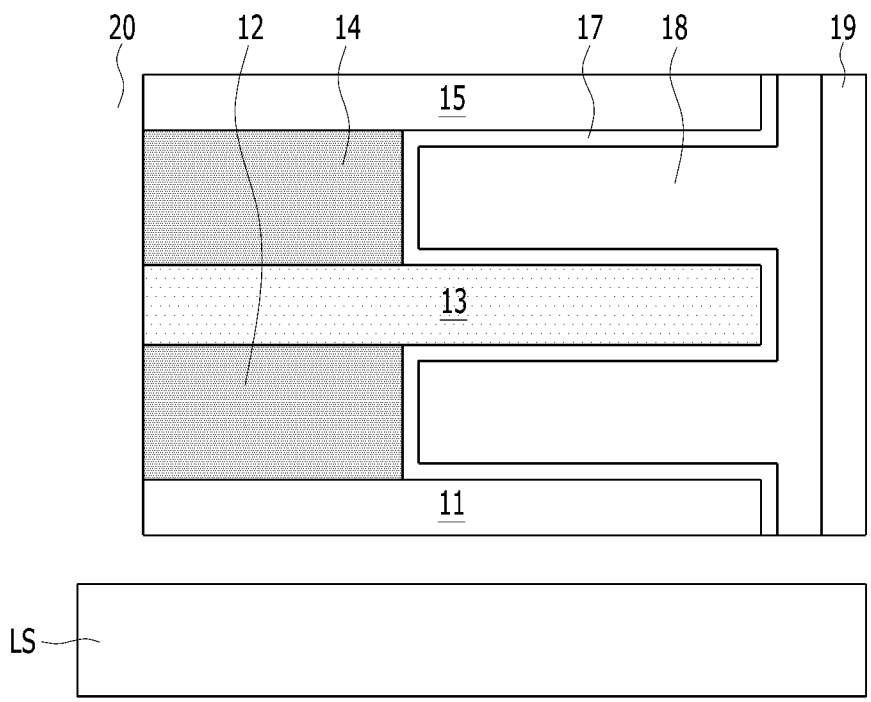

As illustrated in FIG. 6, another portion of the stack body SB may be selectively removed to form a second opening 20.

Figure 7:
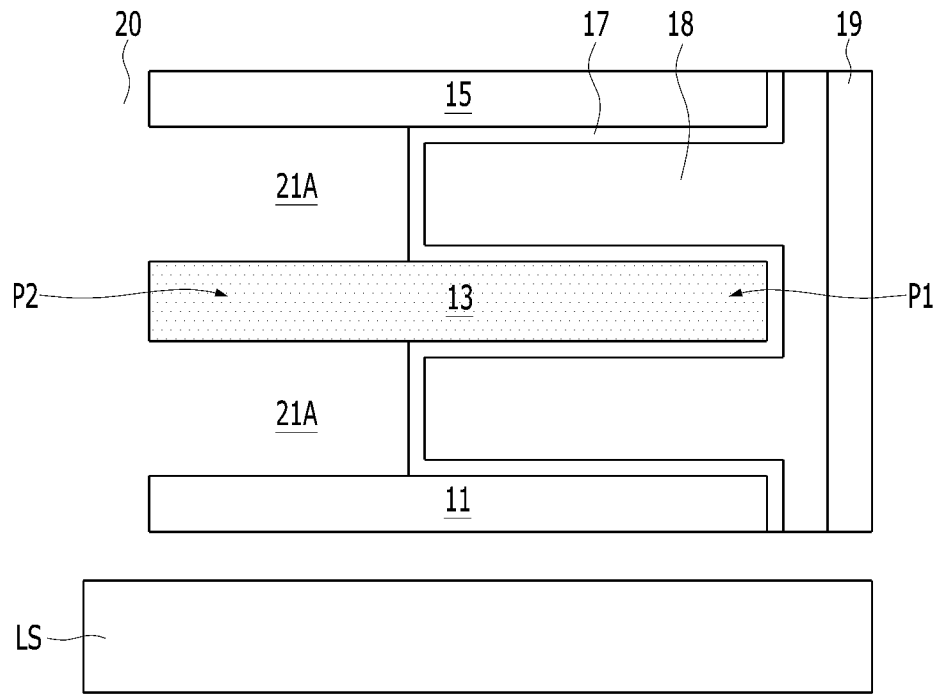

As illustrated in FIG. 7, the first and second sacrificial layers 12 and 14 may be selectively removed through the second opening 20. Accordingly, gate level-recesses 21A and 21B may be formed to expose an upper surface and a lower surface of a second portion P2 of the semiconductor layer 13.

The gate level recesses 21A and 21B may have a double structure, may be disposed between the semiconductor layer 13 and the first dielectric layer 11, and may be further disposed between the semiconductor layer 13 and the second dielectric layer 15.

While the first and second sacrificial layers 12 and 14 are removed, the first liner layer 17 may be used as an etch stop layer.

Figure 8:
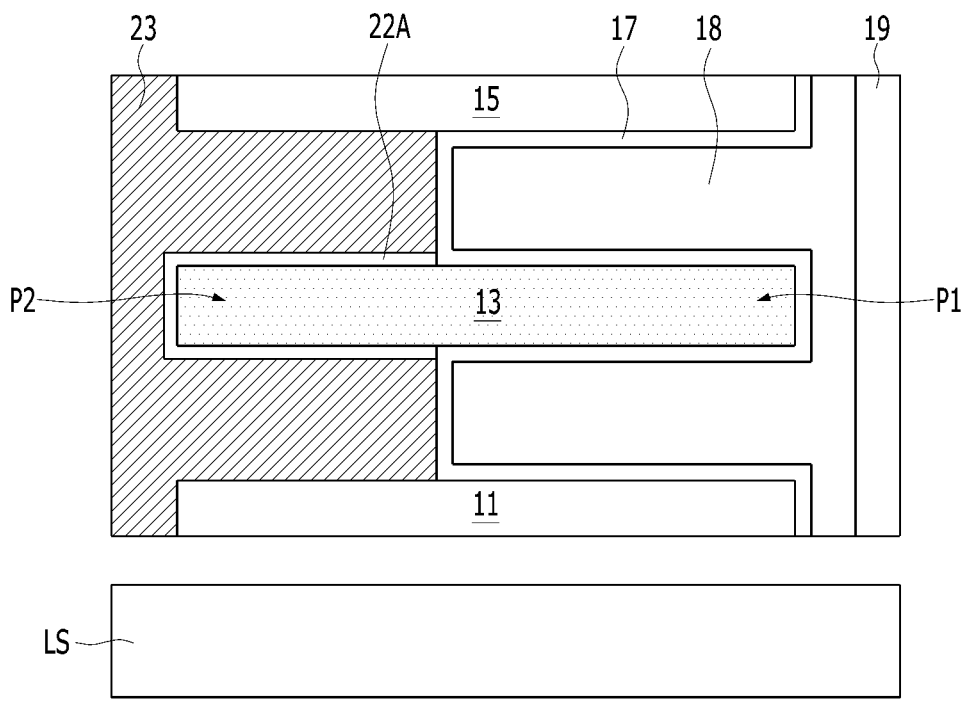

As illustrated in FIG. 8, a horizontal dielectric layer 22A may be formed on an exposed portion of the semiconductor layer 13. The horizontal dielectric layer 22A may be referred to as a gate dielectric layer. The horizontal dielectric layer 22A may include for example silicon oxide, silicon nitride, metal oxide, metal oxynitride, metal silicate, high-k material, ferroelectric material, anti-ferroelectric material, or a combination thereof. The horizontal dielectric layer 22A may include for example $SiO_2$, $Si_3N_4$, $HfO_2$, $Al_2O_3$, $ZrO_2$, AlON, HfON, HfSiO, HfSION, or a combination thereof.

In one embodiment, the horizontal dielectric layer 22A may be formed by a deposition process or an oxidation process. In this embodiment, the horizontal dielectric layer 22A may be formed by an oxidation process of oxidizing the surface of the second portion P2 of the semiconductor layer 13.

Subsequently, a horizontal conductive layer 23 may be formed on the horizontal dielectric layer 22A to fill the gate level-recesses 21A and 21B. The horizontal conductive layer 23 may include a low work function material, a high work function material, or a combination thereof. The horizontal conductive layer 23 may include polysilicon, metal, metal nitride, or a combination thereof.

Figure 9:
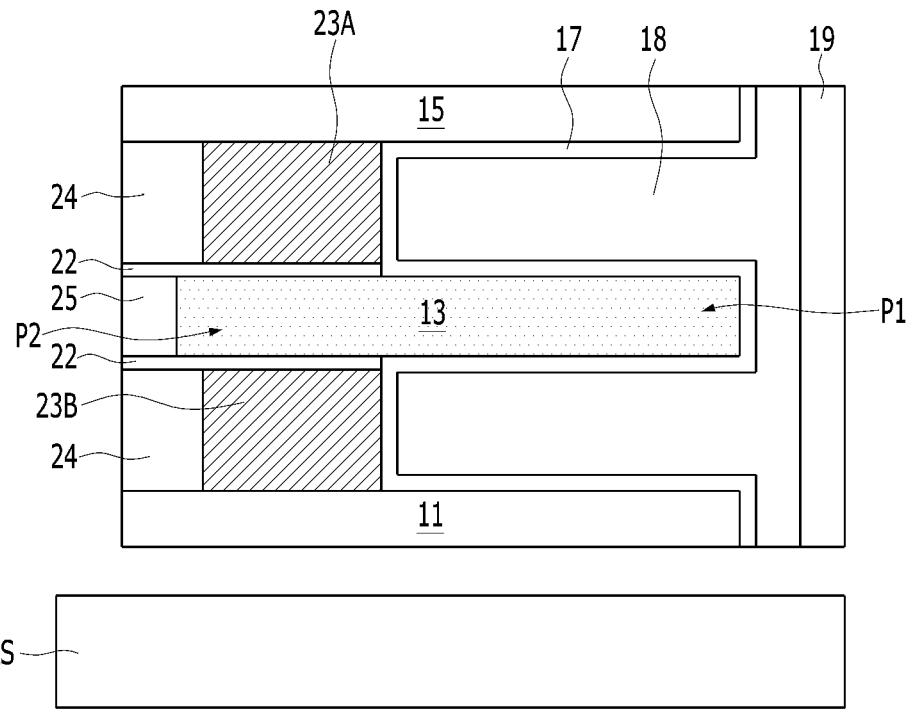

As illustrated in FIG. 9, the horizontal conductive layer 23 may be selectively etched in order to form horizontal conductive lines 23A and 23B having a double structure.

The horizontal conductive lines 23A and 23B may each include polysilicon, metal, metal nitride, or combinations thereof. The horizontal conductive lines 23A and 23B may each include a low work function material, a high work function material, or a combination thereof. The horizontal conductive lines 23A and 23B may be referred to as gate electrodes or word lines.

Subsequently, first capping layers 24 may be formed on side surfaces of the horizontal conductive lines 23A and 23B. The step of forming the first capping layers 24 may include deposition and etching of a dielectric material. The first capping layers 24 may include for example silicon oxide, silicon nitride, SiCN, SiCO, SiCON, or a combination thereof.

After the first capping layers 24 is formed, side surfaces of the semiconductor layer 13 may be exposed by etching the vertical extending portion of horizontal dielectric layer 22A. A gate dielectric layer 22 may be formed between the semiconductor layer 13 and the horizontal conductive lines 23A and 23B from the remaining portion of horizontal dielectric layer 22A not etched when etching the vertical extending portion of horizontal dielectric layer 22A.

Figure 10:
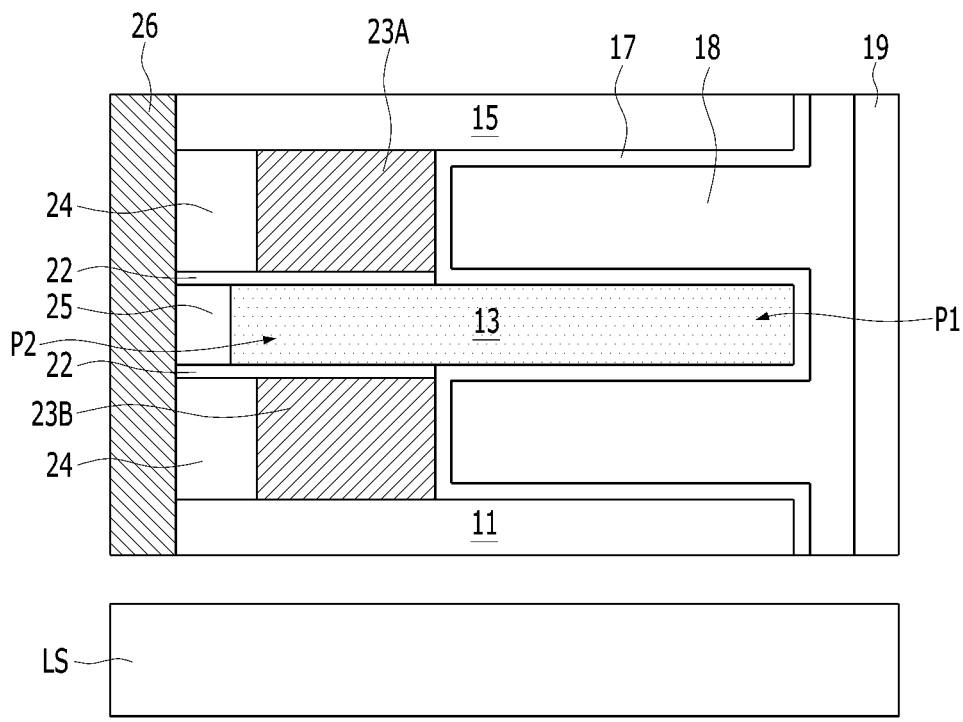

As illustrated in FIG. 10, a vertical conductive line 26 coupled to the second portion P2 of the semiconductor layer 13 may be formed. The vertical conductive line 26 may include titanium nitride, tungsten, or a combination thereof.

Before the vertical conductive line 26 is formed, a first doped region 25 may be formed in the second portion P2 of the semiconductor layer 13. The first doped region 25 may be formed using an impurity doping process. In another embodiment, the step of forming the first doped region 25 may include a step of depositing doped polysilicon against the region 25 to be doped, a subsequent heat treatment step, and a step of removing the doped polysilicon after for example diffusion of impurities in the first doped region 25. In this example, the first doped region 25 is formed by diffusion of impurities from the doped polysilicon by the subsequent heat treatment step. The first doped region 25 may be referred to as a first source/drain region.

Figure 11:
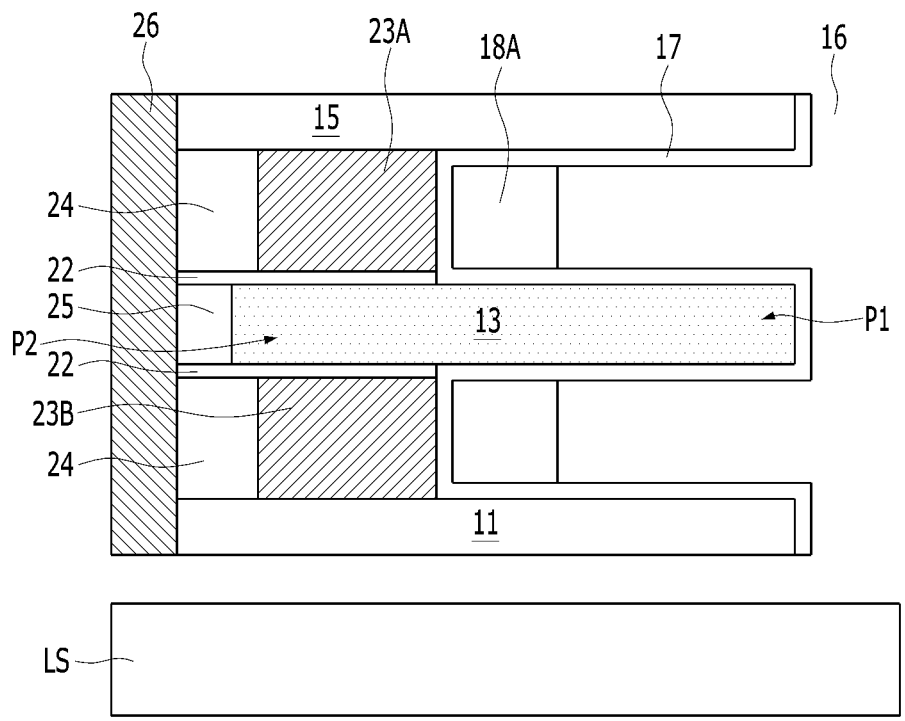
Figure 12:
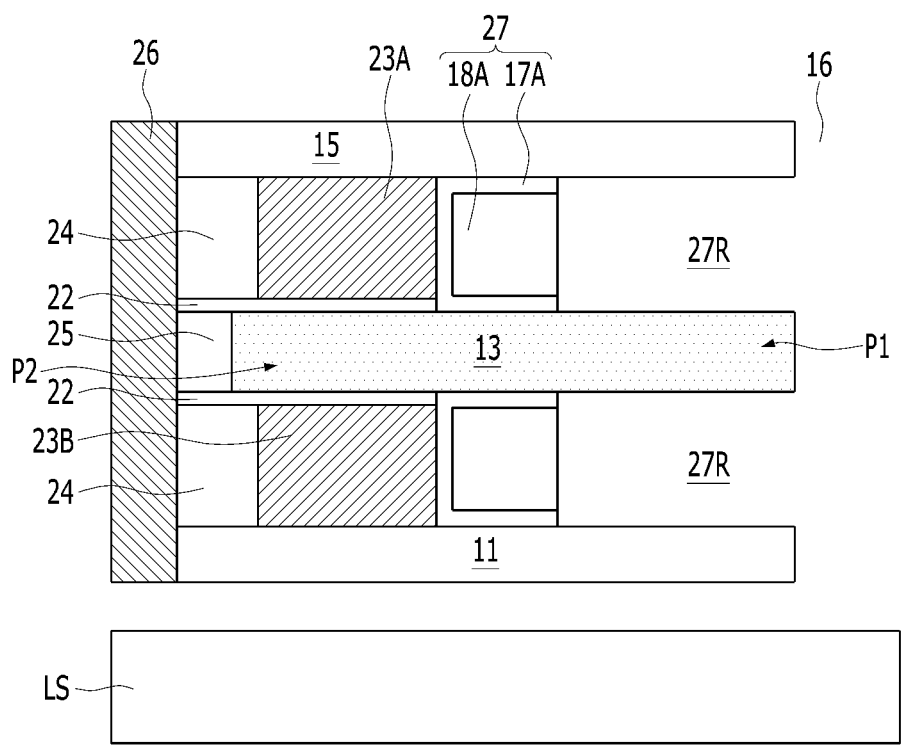

As illustrated in FIGS. 11 and 12, the first and second liner layers 17 and 18 may be selectively recessed in order to form a second capping layer 27. The second capping layer 27 may include a first liner 17A and a second liner 18A. The first liner 17A may be formed by a recess in the first liner layer 17, and the second liner 18A may be formed by a recess in the second liner layer 18. For example, after the second liner layer 18 is horizontally recessed, the first liner layer 17 may be horizontally recessed.

The second liner 18A may include a side surface not covered by the first liner 17A.

As the first and second liners 17A and 18A are formed, the first portion P1 of the semiconductor layer 13 may be partially exposed. After the first and second liners 17A and 18A are formed, a pair of electrode level-recesses 27R may be formed to expose the first portion P1 of the semiconductor layer 13. The first portion P1 of the semiconductor layer 13 may have a protrusion shape.

Figure 13:
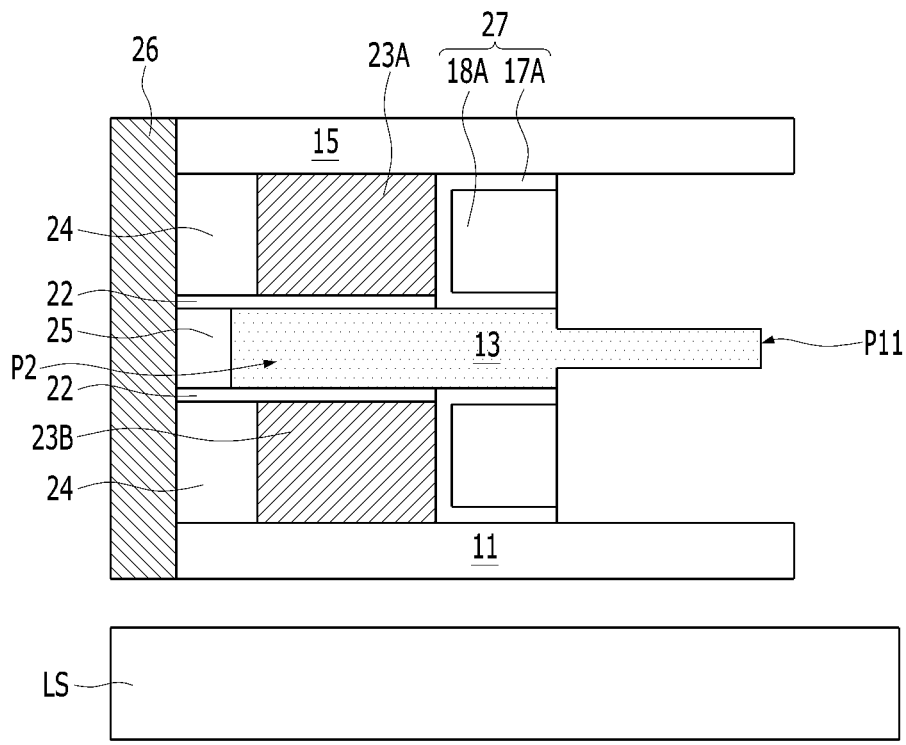

As illustrated in FIG. 13, the first portion P1 of the semiconductor layer 13 exposed by the electrode level-recesses 27R may be thinned. Accordingly, the semiconductor layer 13 may include a thinned first portion P11. Hereinafter, the thinned first portion P11 of the semiconductor layer 13 is referred to as a 'thinned semiconductor layer P11'.

Figure 14:
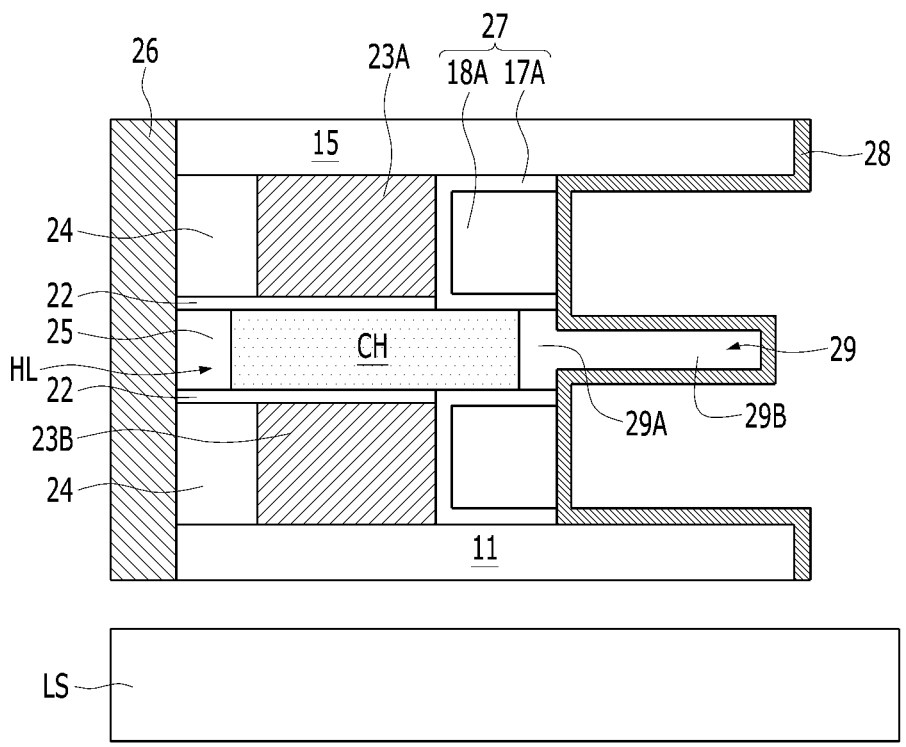

As illustrated in FIG. 14, a sacrificial doped material 28 may be formed on the pair of electrode level-recesses 27R and the thinned semiconductor layer P11. The sacrificial doped material 28 may cover the thinned semiconductor layer P11. The sacrificial doped material 28 may include impurities. For example, the sacrificial doped material 28 may include doped polysilicon.

Subsequently, a second doped region 29 may be formed in the thinned semiconductor layer P11 by diffusing impurities from the sacrificial doped material 28. A channel CH may be defined between the first doped region 25 and the second doped region 29. The semiconductor layer 13 may be a horizontal layer HL, and the horizontal layer HL may include the first doped region 25, the second doped region 29, and the channel CH between the first doped region 25 and the second doped region 29.

The second doped region 29 may include a body portion 29A and a protrusion 29B. The body portion 29A of the second doped region 29 may directly contact the channel CH and the second capping layer 27, and the protrusion 29B of the second doped region 29 may horizontally extend from the body portion 29A. The protrusion 29B of the second doped region 29 may be formed on the thinned semiconductor layer P11.

Figure 15:
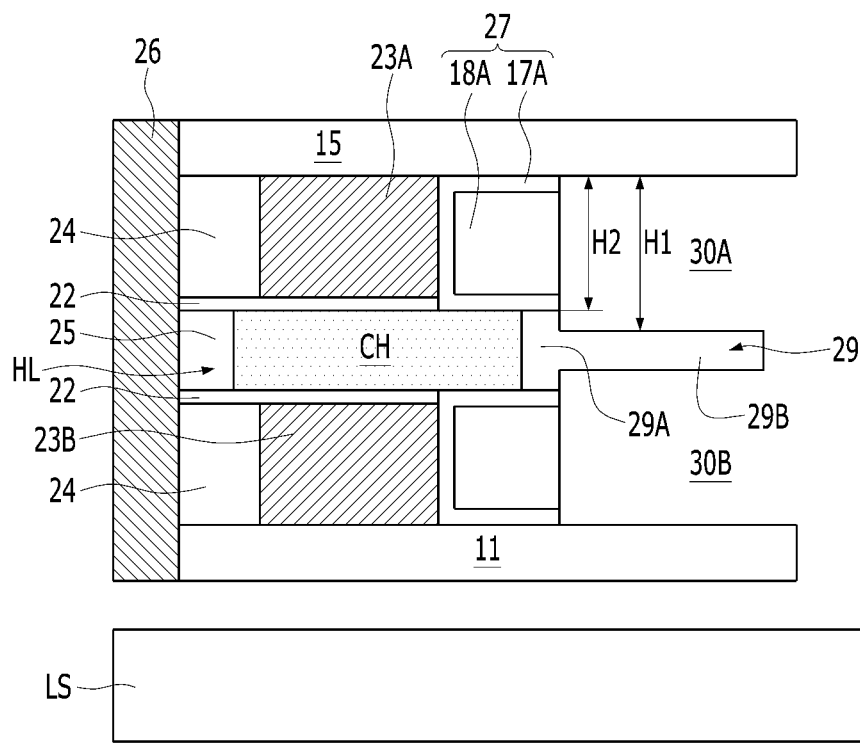

As illustrated in FIG. 15, the sacrificial doped material 28 may be removed.

After the sacrificial doped material 28 is removed, a pair of capping layer level-recesses 30A and 30B may be formed. A part of the second doped region 29 may be exposed by the pair of capping layer level-recesses 30A and 30B. The capping layer level-recesses 30A and 30B may include an upper capping layer level-recess 30A and a lower capping layer level-recess 30B. The second doped region 29 may be disposed between the upper capping layer level-recess 30A and the lower capping layer level-recess 30B. The upper capping layer level-recess 30A may be disposed between the second doped region 29 of the horizontal layer HL and the second dielectric layer 15. The lower capping layer level-recess 30B may be disposed between the second doped region 29 of the horizontal layer HL and the first dielectric layer 11.

A vertical height H1 of each of the capping layer level-recesses 30A and 30B may be greater than a vertical height H2 of the second capping layer 27.

Figure 16:
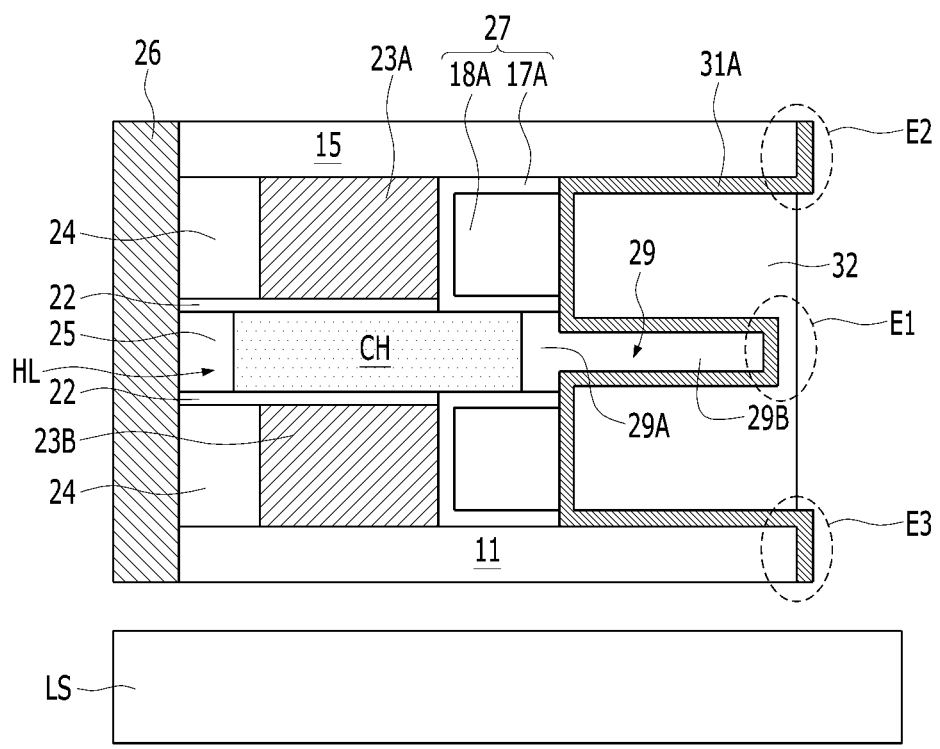

As illustrated in FIG. 16, an electrode material 31A may be conformally formed on the pair of capping layer level-recesses 30A and 30B. An etch stopper 32 may be formed on the electrode material 31A. The etch stopper 32 may fill the pair of capping layer level-recesses 30A and 30B on the electrode material 31A. The etch stopper 32 may include silicon oxide. The electrode material 31A may include a metal-base material such as titanium nitride.

The electrode material 31A may include a non-cutting portion E1 and a plurality of planned cutting portions E2 and E3. The non-cutting portion E1 may refer to a portion to be protected from a subsequent etching process, and the planned cutting portions E2 and E3 may refer to portions to be removed by a subsequent etching process. The non-cutting portion E1 may be fully covered by the etch stopper 32, and the planned cutting portions E2 and E3 may be non-covered by the etch stopper 32. The non-cutting portion E1 may cover one side surface of the protrusion 29B of the second doped region 29.

Figure 17:
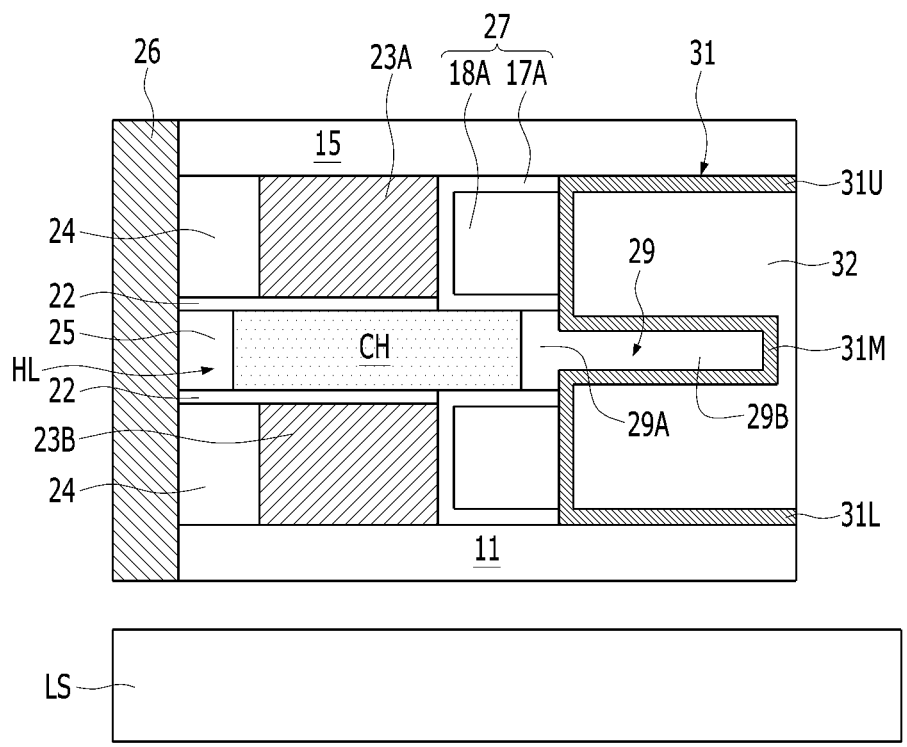

As illustrated in FIG. 17, the electrode material 31A may be selectively etched by using the etch stopper 32 as a barrier, and thus a first electrode 31 may be formed. The first electrode 31 may have a hybrid cylindrical shape. The hybrid cylindrical shape may refer to a structure in which a plurality of cylinders are merged. For example, the first electrode 31 may include a first cylinder 31U, a second cylinder 31L, and a connection portion 31M between the first cylinder 31U and the second cylinder 31L. The first and second cylinders 31U and 31L may be electrically connected to the second doped region 29 of the horizontal layer HL. The first cylinder 31U and the second cylinder 31L may be electrically connected to each other through the connection portion 31M. The first cylinder 31U may be disposed on the upper surface of the second doped region 29, the second cylinder 31L may be disposed on the lower surface of the second doped region 29, and the connection portion 31M may be disposed on one side surface of the second doped region 29. The first cylinder 31U may be disposed on the upper surface of the protrusion 29B of the second doped region 29, the second cylinder 31L may be disposed on the lower surface of the protrusion 29B of the second doped region 29, and the connection portion 31M may be disposed on one side surface of the protrusion 29B of the second doped region 29. The connection portion 31M may be covered by the etch stopper 32. An inner surface of the first cylinder 31U and an inner surface of the second cylinder 31L may be covered by the etch stopper 32. An outer surface of the first cylinder 31U and an outer surface of the second cylinder 31L may contact the second capping layer 27.

Figure 18:
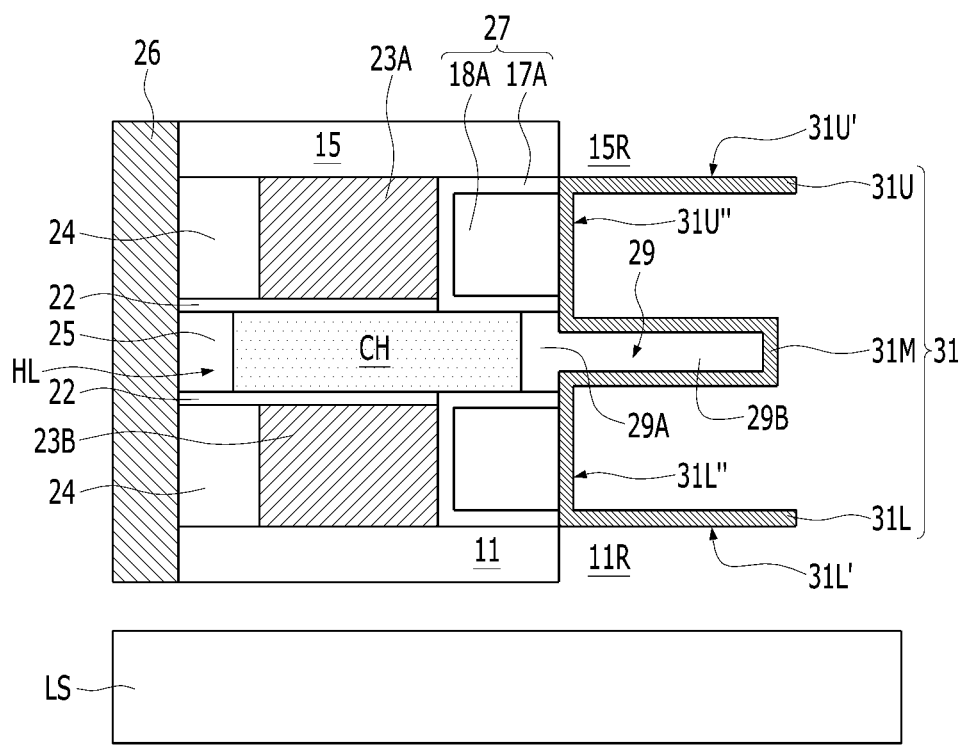

As illustrated in FIG. 18, the etch stopper 32 may be removed, and the first dielectric layer 11 and the second dielectric layer 15 may sequentially partially recessed (see reference numerals 11R and 15R). Accordingly, a lowest level-outer surface 31L' of the first electrode 31 may be exposed by the partial recess 11R of the first dielectric layer 11, and a highest-level outer surface 31U' of the first electrode 31 may be exposed by the partial recess 15R of the second dielectric layer 15. As the etch stopper 32 is removed, inner surfaces 31U" and 31L" of the first electrode 31 may be exposed. For example, the inner surface 31U" of the first cylinder 31U and the inner surface 31L" of the second cylinder 31L may be exposed.

Through a series of processes described above, the first electrode 31 coupled to the second doped region 29 of the horizontal layer HL and having a hybrid cylindrical shape may be formed. The first electrode 31 may include the first cylinder 31U, the second cylinder 31L, and the connection portion 31M between the first cylinder 31U and the second cylinder 31L. The first electrode 31 may further include the lowest level-outer surface 31L', the highest level-outer surface 31U', and the inner surfaces 31U" and 31L". The hybrid cylindrical shape of the first electrode 31 may also be referred to as a double cylinder structure.

Figure 19:
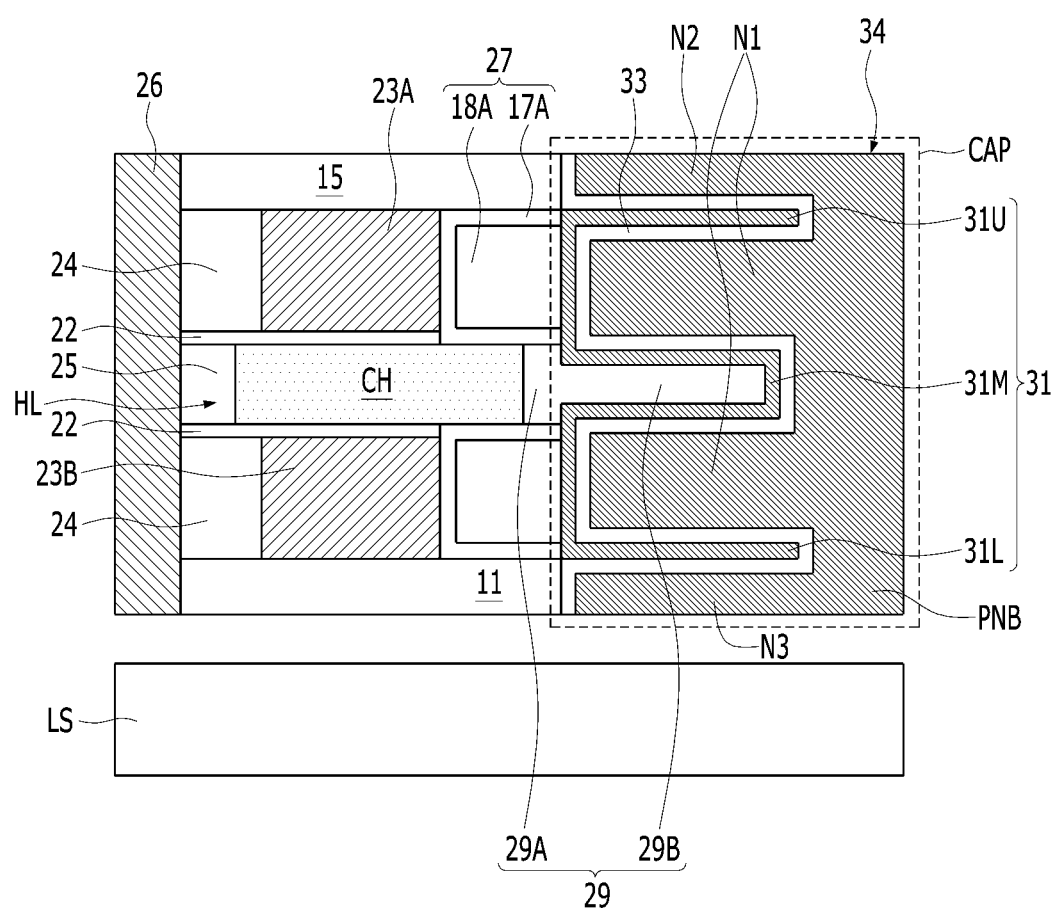

As illustrated in FIG. 19, a capacitor dielectric layer 33 and a second electrode 34 may be sequentially formed on the first electrode 31. The first electrode 31, the capacitor dielectric layer 33, and the second electrode 34 may configure one data storage element CAP.

The second electrode 34 may include an electrode body PNB and extension portions $N_1$ to $N_3$ expanding (or otherwise extending) from the electrode body PNB. The electrode body PNB may be coupled in common to the extension portions $N_1$ to $N_3$. The electrode body PNB and the extension portions $N_1$ to $N_3$ may have an integral structure. The extension portions $N_1$ to $N_3$ may include first extension portions $N_1$, a second extension portion $N_2$, and a third extension portion $N_3$. The first extension portions $N_1$ may be disposed above the inner sides of the first and second cylinders 31U and 31L. The second extension portion $N_2$ may be disposed above the highest level-outer surface of the first electrode 31, and the third extension portion $N_3$ may be disposed below the lowest level-outer surface of the first electrode 31.

Figure 20:
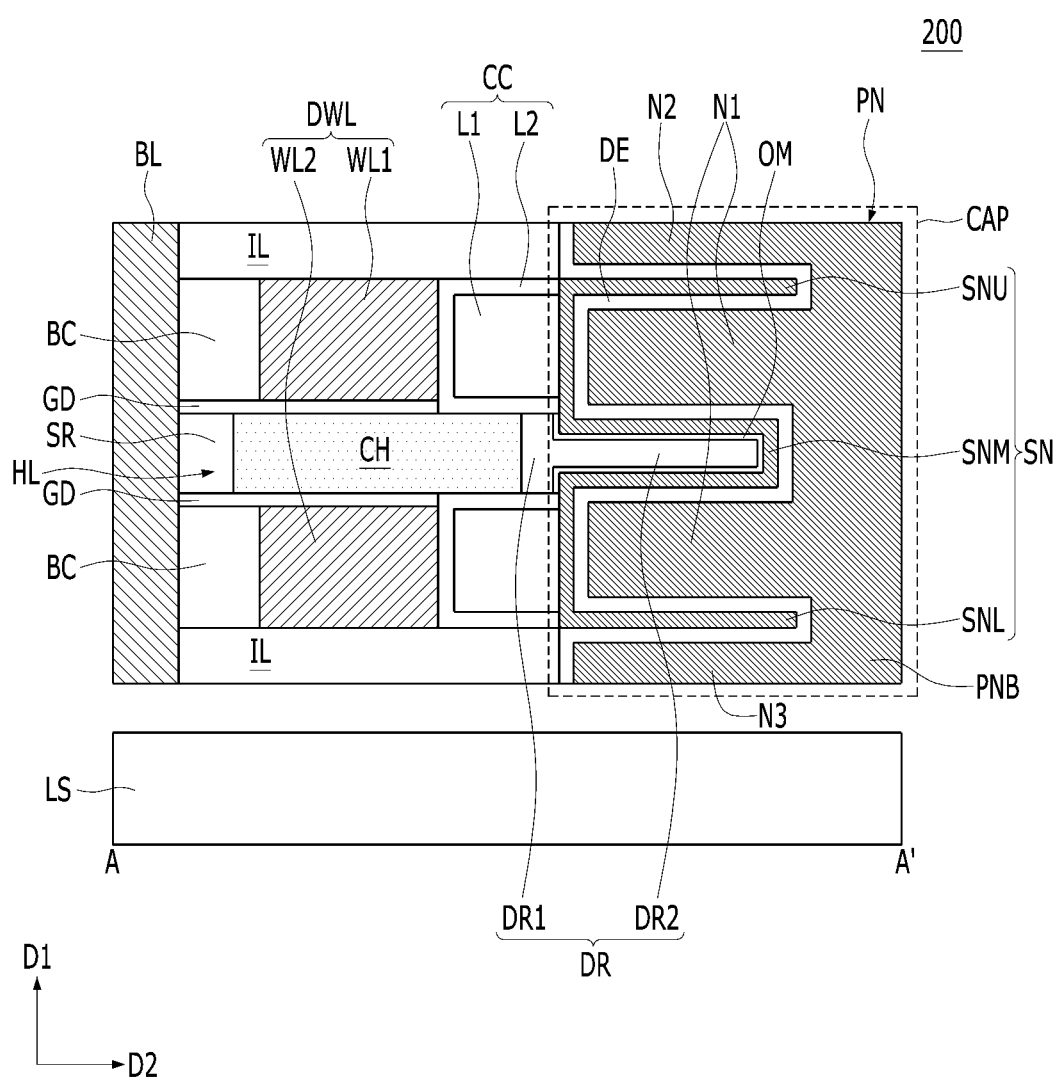
FIG. 20 is a schematic cross-sectional view of a memory cell in accordance with another embodiment.

FIG. 20 is a schematic cross-sectional view of a memory cell 200 in accordance with another embodiment.

The memory cell 200 in FIG. 20 may be substantially the same as the memory cell MC in FIG. 2A and FIG. 2B. For a detailed description of overlapping components except for an ohmic contact OM, refer to the descriptions of FIG. 2A and FIG. 2B.

Referring to FIG. 20, the ohmic contact OM may be disposed between a first electrode SN and a second doped region DR. The ohmic contact OM may include a metal-base material, such as for example, metal silicide. Since the second doped region DR has a protruding shape and an area where the ohmic contact OM is to be formed increases by the protruding length of the second doped region DR, contact resistance may be improved.

The present disclosure described above is not limited to the aforementioned embodiment and the accompanying drawings, and those skilled in the art to which the present disclosure pertains will recognize that various replacements, modifications, and changes can be made without departing from the technical aspects and improvements described in the present disclosure.

What is claimed is:
1. A semiconductor device comprising:
   a vertical conductive line;
   a horizontal layer horizontally oriented from the vertical conductive line and including a first horizontal portion and a second horizontal portion thinner than the first horizontal portion;
   a horizontal conductive line crossing the first horizontal portion of the horizontal layer; and
   a data storage element including a first electrode including a merged double cylinder coupled to the second horizontal portion of the horizontal layer.

2. The semiconductor device of claim 1, wherein the second horizontal portion of the horizontal layer has a smaller vertical thickness than the first horizontal portion.

3. The semiconductor device of claim 1, wherein the horizontal layer includes single crystal silicon, oxide semiconductor, polysilicon, or a combination thereof.

4. The semiconductor device of claim 1, wherein the merged double cylinder of the first electrode comprises:
   a first cylinder disposed over an upper surface of the second horizontal portion of the horizontal layer;
   a second cylinder disposed below a lower surface of the second horizontal portion of the horizontal layer; and
   a connection portion disposed between the first cylinder and the second cylinder.

5. The semiconductor device of claim 4, wherein a horizontal orientation length of each of the first and second cylinders is greater than a horizontal orientation length of the second doped region.

6. The semiconductor device of claim 4, wherein the first cylinder includes a first inner surface and an uppermost level outer surface, and
   the second cylinder includes a second inner surface and a lowermost level outer surface.

7. The semiconductor device of claim 6, wherein the data storage element further comprises:
   a dielectric layer over the first electrode; and
   a second layer over the dielectric layer.

8. The semiconductor device of claim 7, wherein the dielectric layer covers a surface of the connection portion, a first inner surface and an uppermost level outer surface of the first cylinder, and a second inner surface and a lowermost level outer surface of the second cylinder.

9. The semiconductor device of claim 7, wherein the second electrode comprises:
   a vertically oriented electrode body;
   a plurality of inner extension portions horizontally extending from the electrode body and disposed over a first inner surface of the first cylinder and a second inner surface of the second cylinder; and
   a plurality of outer extension portions horizontally extending from the electrode body and disposed above an uppermost level outer surface of the first cylinder and below a lowermost level outer surface of the second cylinder.

10. The semiconductor device of claim 9, wherein a vertical height of the inner extension portions is higher than a vertical height of the second doped region.

11. The semiconductor device of claim 1, further comprising:
   a metal silicide disposed between the second horizontal portion of the horizontal layer and the first electrode.

12. The semiconductor device of claim 1, further comprising:
   a first capping layer disposed between the vertical conductive line and the horizontal conductive line; and
   a second capping layer disposed between the horizontal conductive line and the first electrode.

13. The semiconductor device of claim 12, wherein the second capping layer includes a first liner and a second liner, and the second liner has a shape that fills an inner surface of the first liner.

14. The semiconductor device of claim 1, wherein the horizontal layer comprises:
   a first doped region coupled to the vertical conductive line;
   a second doped region coupled to the first electrode; and
   a channel between the first doped region and the second doped region,
   wherein the first doped region and the channel are disposed over a first horizontal portion of the horizontal layer.

15. The semiconductor device of claim 14, wherein the second doped region comprises:
   a body portion disposed over the first horizontal portion of the horizontal layer; and
   a protrusion extending from the body portion and disposed over a second horizontal portion of the horizontal layer,
   wherein a horizontal orientation length of the protrusion is greater than a horizontal orientation length of the body portion.

* * * * *